United States Patent [19]

Itoh et al.

[11] Patent Number: 5,315,123
[45] Date of Patent: May 24, 1994

[54] ELECTRON BEAM LITHOGRAPHY APPARATUS

[75] Inventors: Hiroyuki Itoh; Minoru Sasaki, both of Katsuta, Japan

[73] Assignee: Hitachi, Ltd., Tokyo, Japan

[21] Appl. No.: 950,701

[22] Filed: Sep. 25, 1992

[30] Foreign Application Priority Data

Sep. 25, 1991 [JP] Japan ................... 3-243872

[51] Int. Cl.$^5$ ............................................ H01J 37/302
[52] U.S. Cl. ............................. 250/492.2; 250/491.1
[58] Field of Search .................. 250/398, 491.1, 492.2

[56] References Cited

U.S. PATENT DOCUMENTS

| | | | |
|---|---|---|---|
| 4,390,788 | 6/1983 | Hayashi et al. | 250/491.1 |
| 4,511,980 | 4/1985 | Watanabe | 250/398 |
| 4,558,225 | 12/1985 | Gotou et al. | 250/491.1 |
| 4,647,782 | 3/1987 | Wada et al. | 250/398 |
| 4,698,509 | 10/1987 | Wells et al. | 250/398 |
| 4,789,945 | 12/1988 | Niijima | 250/398 |
| 5,047,647 | 9/1991 | Itoh et al. | |
| 5,083,032 | 1/1992 | Suzuki | 250/398 |

FOREIGN PATENT DOCUMENTS 63-308317 12/1988 Japan .
1-102929 4/1989 Japan .

*Primary Examiner*—Bruce C. Anderson
*Attorney, Agent, or Firm*—Antonelli, Terry, Stout & Kraus

[57] ABSTRACT

Drift values of exposure position of an electron beam are obtained through detection of a reference mark on a sample stage and a drift characteristic formula which expresses the exposure positions of the electron beam is corrected by using a plurality of the drift values. The electron beam is controlled to expose some lithographic pattern by estimating the exposure position in real time at which the electron beam is irradiated at the estimated exposure position based on the drift characteristic formula without detecting the reference mark, and further to expose other lithographic pattern by calculating the exposure position based on the drift characteristic formula by detecting the reference mark. The measuring of the drift which takes much time are partly taken place at few limitted positions and the correction of the exposure positions is effectively in a short time.

21 Claims, 3 Drawing Sheets

ELECTRON BEAM LITHOGRAPHY APPARATUS

BACKGROUND OF THE PRESENT INVENTION

The present invention relates to an electron beam lithography apparatus capable of accurately and efficiently correcting the drift of the electron-beam applying position.

The general electron beam lithography apparatus has a problem that a drawing position error occurs because an electron beam applied to a projection mask for light exposure or a circuit pattern on a silicon wafer drifts from a predetermined drawing position due to external fluctuation factors including the ambient temperature of an apparatus, atmospheric pressure, and external magnetic field such as earth magnetism, or internal fluctuation factors including electrification due to contamination in an electron beam column and fluctuation of deflection control system characteristics.

To solve the above problem, conventionally, a reference mark set on a sample stage is detected by the electron beam, the electron-beam deflecting signal value at the detection of the reference mark is compared with the preset standard signal value to obtain the difference between the values (deflection error or position error), and thereby, the drawing position error is corrected.

Japanese Patent Laid-open No. 63-308317(1988) discloses that, in order to further improve the above problem, an estimated curve of position drift is generated by using data for the deflection error (position drift) in drawing of several times in the past and thereby, the drift for the next-time drawing is estimated to previously correct the sample stage position, and moreover, the position drift is regularly measured in drawing to further correct the previously-corrected sample stage position each time.

SUMMARY OF THE PRESENT INVENTION

In the general lithography apparatus as explained above, the correction frequency and mark position detecting conditions necessary to realize the required drawing accuracy are determined by considering experimental position drift records and installation conditions.

But, as the position drift is generally maximized at start of apparatus, it is necessary to frequently compensate the drift at start. Therefore, there is a problem that drift compensation is inefficient because the compensation frequency extremely increases when the position drift is relatively small if the drift compensation frequency is set to the time of the start.

Moreover, when the mark detection accuracy is degraded due to increase of noises of the deflection system or contamination of marks, degradation of the accuracy is prevented by increasing the mark position measuring frequency and decreasing the influence of random noises through averaging. However, this also causes the throughput of the apparatus to decrease.

Especially, the above problem is actualized for a projection mask for light exposure requiring a long drawing time.

Furthermore, the method disclosed in Japanese Patent Laid-open No. 63-308317(1988) has a problem that responses are slow and the positioning accuracy is relatively low because, as already known, the sample stage position is mechanically controlled though the drawing position error is corrected by moving the sample stage on which a wafer is mounted.

An object of the present invention is to overcome the problems as stated above, and in order to solve such problems, an electron beam is applied to a reference mark on a sample stage to detect the electron-beam position drift (position error) with the reflected electron signals and store the position drift values in a memory, a drift characteristic formula changed with real time at which the electron beam is irradiated is calculated by using a plurality of position drift values stored in the memory, and thereby, the electron-beam deflecting signal is corrected based on the drift characteristic formula.

The characteristic feature of the present invention is in estimating some exposure position of the electron beam in the real time at which the electrom beam is irradiated based on the drift characteristic formula without detecting the reference mark so as to expose some lithographic pattern at the some exposure position, and calculating other exposure position of the electron beam based on the drift characteristic formula by detecting the reference mark so as to expose other lithographic patterns at the other exposure position.

The drift characteristic formula stated above is calculated by approximating it to a polygonal line or a quadratic or higher-order algebraic equation and approximations of the drift characteristic formula are computed through the least squares method.

Furthermore, the drift characteristic formula is corrected with the position drift values detected with every subsequent lithography process to gradually improve the accuracy of the drift characteristic formula.

In addition to the above, the interval of the position-drift detection time is set so that it is inversely proportional to the gradient at the position drift detection time just before the time concerned of the drift characteristic formula.

Moreover, correction of the deflecting signal with the drift characteristic formula is performed in the blanking period of the electron beam.

By making the interval of the position drift detection time inversely proportional to the gradient of the drift characteristic formula, the position drift detection frequency is decreased when the position drift slowly changes.

By performing correction of the position drift in the blanking period of the electron beam, the electron beam position is not influenced by the change due to correction during drawing.

DETAILED DESCRIPTION OF THE PREFERRED EMBODIMENTS

An embodiment of the present invention will be explained by using FIGS. 1, 2, 3 and 4, in which the future position drift characteristic is estimated by using the electron-beam position drift data in the past drawing, and the electron beam position is previously corrected with the estimated value for drift in order to perform drawing.

Figure 1:
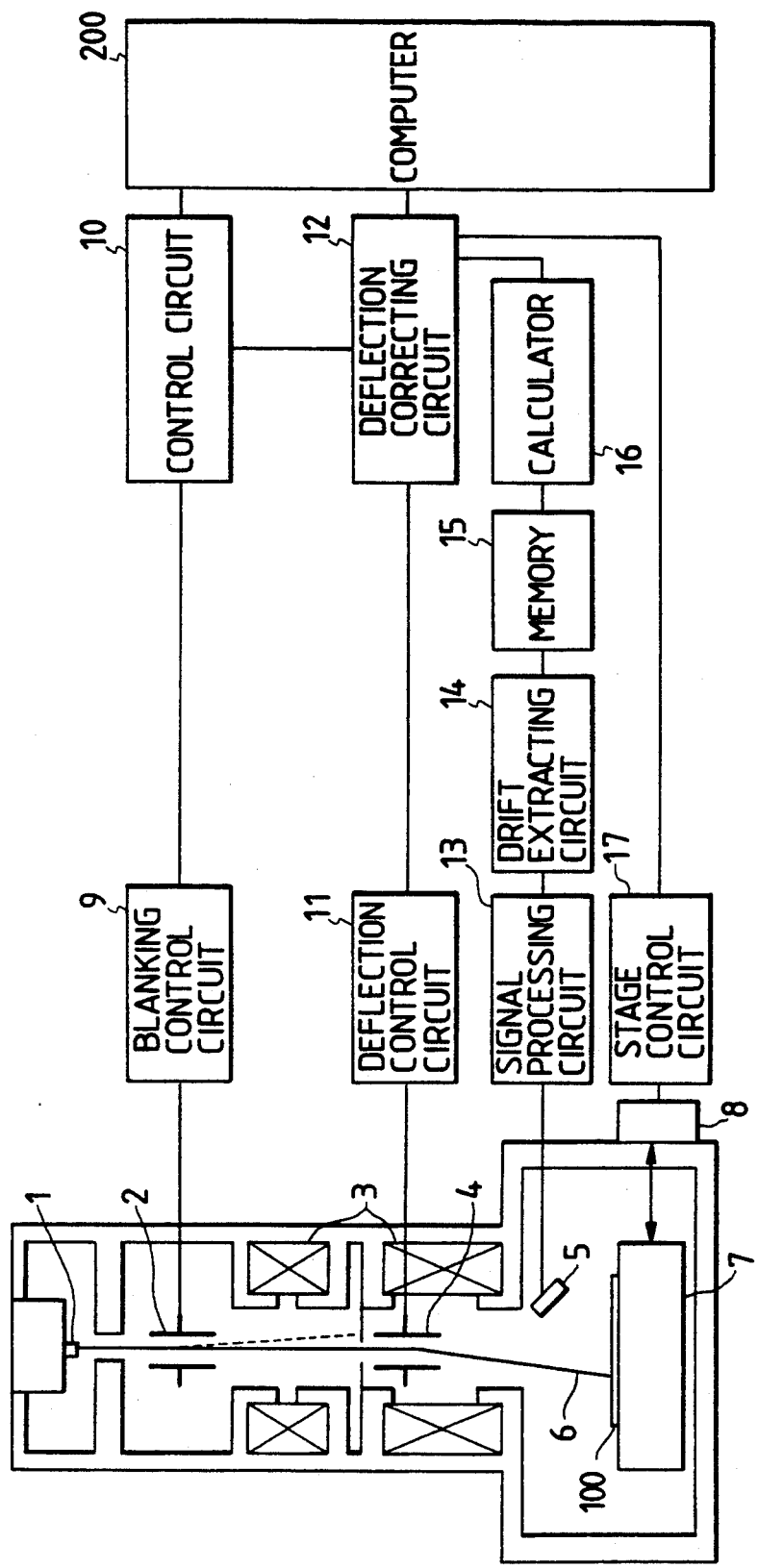
FIG. 1 is a schematic block diagram of the electron beam lithography apparatus according to the present invention in the present invention.

In FIG. 1 showing a construction of an electron beam lithography apparatus of the present invention, the electron beam 6 emitted from the cathode 1 is converged by the electron lens group 3 and applied to the sample 100.

The control computer 200 sends sample stage position signals to the sample stage position control circuit 17 through the deflection correcting circuit 12 and positions the sample stage 7 by driving the sample stage driving mechanism 8.

The control computer 200 sends blanking signals to the blanking control circuit 9 through the drawing sequence control circuit 10.

The computer 200 also sends drawing data to the deflection control circuit 11 to control the drawing position of the electron beam 6.

Figure 4:
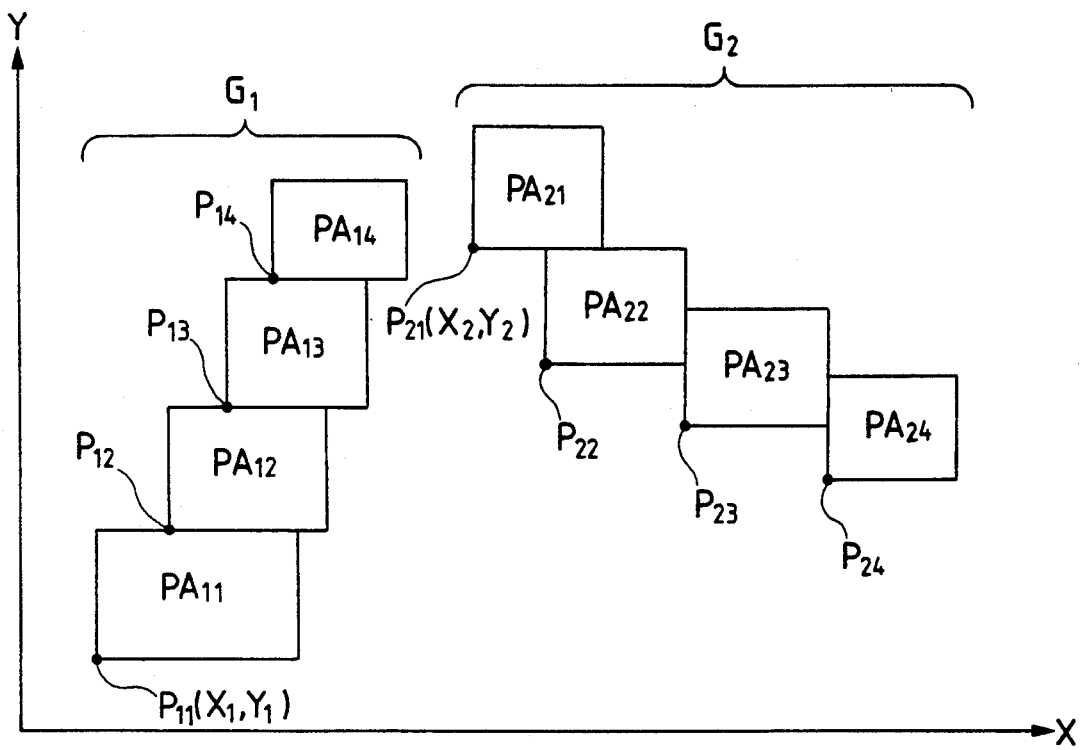
FIG. 4 is a schematic diagram which shows a correcting timing relation of a drift characteristic formula in the present invention.

All circuit patterns $PA_{11}$, $PA_{12}$, $PA_{13}$, $PA_{14}$, $PA_{21}$, $PA_{22}$, $PA_{23}$, $PA_{24}$ on the sample in FIG. 4 are sectioned for each deflection field area and successively exposed. In FIG. 4, exposure positions of the electron beam 6 which expose patterns $PA_{11}$, $PA_{12}$, $PA_{13}$, $PA_{14}$, $PA_{21}$, $PA_{22}$, $PA_{23}$, $PA_{24}$ on the sample are respectively shown with $P_{11}$, $P_{12}$, $P_{13}$, $P_{14}$, $P_{21}$, $P_{22}$, $P_{23}$, $P_{24}$. The pattern $PA_{11}$ is exposed first and then the pattern $PA_{12}$ is exposed next, and the patterns $PA_{13}$, $PA_{14}$, $PA_{21}$, $PA_{22}$, $PA_{23}$, $PA_{24}$ are exposed next by next.

While the sample is moved from a specified exposure position, for example $P_{11}$, to the next exposure position, for example $P_{12}$, in a beam deflection field, the beam 6 is moved to the position shown by a dotted line in FIG. 1 with the blanking signal to interrupt the beam with an aperture at the lower stage.

In order to move the sample between beam deflection fields, the sample stage 7 is moved to the next beam deflection field with the sample stage position signal.

A reference mark is fixed on the stage sample 7 in addition to the sample 100 and thereby, position drift of the exposure position during lithography with the electron beam 6 is measured.

The reference mark 18 is scanned with the beam by the beam deflector 4, the reflected electron signals are detected by the reflected electron detector 5 and waveform-shaped by the signal processing circuit 13, and the position drift values of the beam 6 are extracted by the drift extracting circuit 14 to store them in the memory 15.

The drift characteristic calculating circuit 16 calculates a drift characteristic formula by using the position drift values stored in the drift memory to send the calculated data to the deflection correcting circuit 12.

The deflection correcting circuit 12 applies drift correction to the deflecting signal by using the drift characteristic formula.

Figure 2:
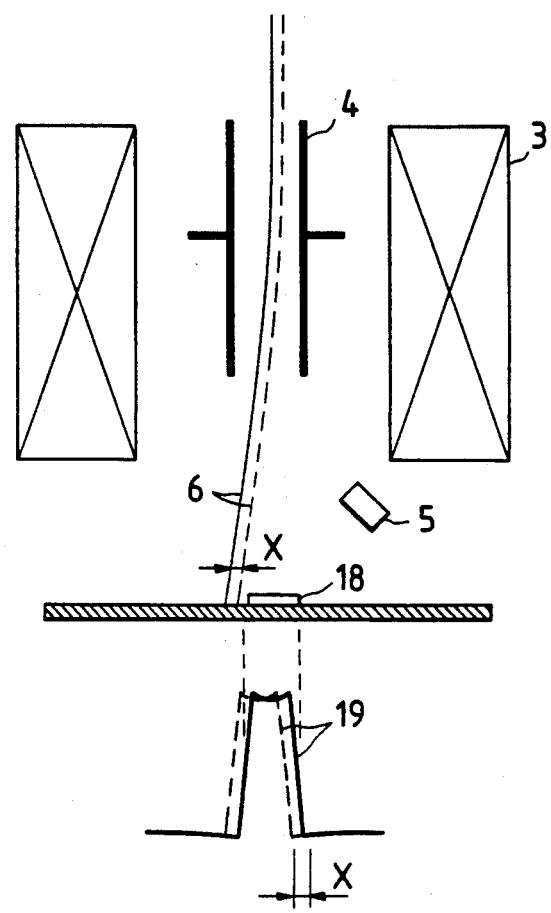
FIG. 2 is an illustration of the method for detecting electron-beam position drift by using a reference mark in the present invention.

FIG. 2 is an illustration for explaining a method for measuring the position drift of the exposure position of the electron beam 6, which shows the state where the beam 6 is deflected in the X-direction as an example.

When it is assumed that the mark waveform 19 at the beginning of drawing is shown by a solid line and the mark waveform 19 after a certain time elapses is shown by a dotted line, the deviation X between the both waveforms comes to the X-component of the beam position drift to the sample stage.

The position coordinates of these mark waveforms correspond to those of the sum of the position coordinates of the sample stage and the central position coordinates of the mark waveform on the sample stage and the beam position drift X corresponds to the difference between the continuous- and dotted-line mark waveform position coordinates.

The beam position drift X is stored in the drift memory each time.

The drift characteristic calculator 16 calculates a drift characteristic expression approximated to a polygonal line or a drift characteristic formula approximated to a quadratic or higher-order algebraic equation like the formula (1) by using the above drift data.

Each of the above drift characteristic formula is expressed by two temporal functions of X-direction component X and Y-directional component Y in a real time at which the electron beam is irradiated on the sample as follows:

$$X = a_0 + a_1 t + a_2 t^2 + \ldots$$
$$Y = b_0 + b_1 t + b_2 t^2 + \ldots \quad (1)$$

The above coefficients $a_0$, $a_1$, $a_2$, ..., $b_0$, $b_1$ and $b_2$ are obtained through the method of least squares and "t" represents the real time.

As the order of the multinomial increases, the degree of approximation is improved. However, a quadratic is enough for practical use because the position drift uniformly increases in general and becomes saturated comparatively simply.

A quadratic makes it possible to determine the coefficients $a_0$, $a_1$, and $a_2$, and $b_0$, $b_1$, and $b_2$ by using three or more points drift measured values.

When the number of drift measuring points per drawing is 3 or more, the above coefficients are calculated by applying the least squares method.

Using the drift characteristic formula approximated to a quadratic or higher-order equation, the drift characteristic formula approximated to an algebraic equation is calculated by using at least three drift measured values at the beginning of the lithography and thereby, the next position drift value in a next real time is estimated to correct the exposure position of the beam without measuring the position drift and the exposure is performed using the estimated position value. At the same time, the next drift measuring point is determined with the gradient (time differentiated value) of the drift characteristic formula to measure drift and the drift characteristic formula is corrected by measuring the position drift by detecting the reference mark on the stage. Similarly hereafter, correction of the exposure position performed by estimating in the real time based on the drift characteristic formula without measuring the drift, and the determination of the next drift measuring point and the correction of the drift characteristic formula based on the drift measuring are repeated as shown in FIG. 4.

The electron beam is exposed on the exposure positions $P_{11}$, $P_{12}$, $P_{13}$, $P_{14}$, $P_{21}$, $P_{22}$, $P_{23}$, $P_{24}$ so as to respectively form the patterns $PA_{11}$, $PA_{12}$, $PA_{13}$, $PA_{14}$, $PA_{21}$, $PA_{22}$, $PA_{23}$, $PA_{24}$ on the sample. The exposure positions $P_{11}$, $P_{12}$, $P_{13}$, $P_{14}$ of the patterns $PA_{11}$, $PA_{12}$, $PA_{13}$, $PA_{14}$ in a group G1 are calculated based on the drift measured at only the position $P_{11}(X_1, Y_1)$.

At first, the drift at the exposure position $P_{11}$ is measured by detecting the reference mark 18 on the stage 7, the drift characteristic formula is corrected by using the measured drift and the pattern $PA_{11}$ is exposed at the exposure positions $P_{11}$ which is corrected.

After the exposure of the pattern $PA_{11}$, the pattern $P_{12}$ is exposed at the position $P_{12}$ based on the drift characteristic formula without measuring the reference mark 18. The position $P_{12}$ is estimated based on the drift characteristic formula by correcting a positional difference between the positions $P_{11}$ and $P_{12}$ and the time difference between the real times at which the electron beam is irradiated to the positions $P_{11}$ and $P_{12}$.

In the same way, the patterns $P_{13}$, and $P_{14}$ are exposed at the positions $P_{13}$ and $P_{14}$ based on the drift characteristic formula without measuring the reference mark 18.

Relating to the patterns $PA_{21}$, $PA_{22}$, $PA_{23}$, $PA_{24}$ on the sample at the exposure positions $P_{21}$, $P_{22}$, $P_{23}$, $P_{24}$ in group G2, the drift at the exposure position $P_{21}$ is measured by detecting the reference mark 18 on the stage 7, the drift characteristic formula is corrected by using the measured drift and the pattern $PA_{21}$ is exposed at the exposure positions $P_{21}$ which is corrected.

After the exposure of the pattern $PA_{21}$, the pattern $P_{22}$ is exposed at the position $P_{22}$ based on the drift characteristic formula without measuring the reference mark 18. The position $P_{22}$ is estimated based on the drift characteristic formula by correcting a positional difference between the positions $P_{21}$ and $P_{22}$ and the time difference between the real times at which the electron beam is irradiated to the positions $P_{21}$ and $P_{22}$.

In the same way, the patterns $P_{23}$ and $P_{24}$ are exposed at the positions $P_{23}$ and $P_{24}$ based on the drift characteristic formula without measuring the reference mark 18.

Therefore, the measuring of the drift which takes much time are taken place at only the positions $P_{11}$, $P_{21}$ in the groups G1, G2 and the correction of the exposure positions is effectively in a short time. Further, the following is the description of how to set the timing for measuring the above drift.

For the present invention, the drift measuring interval "$\Delta t$" is so set that it is inversely proportional to the gradient of the drift characteristic formula, so that the change width of each drift measured value every measuring interval 637 $\Delta t$" becomes equal on the average.

The drift measuring interval "$\Delta t$" can approximately be determined by the formula (2) using the sum of squares of linear coefficients of the drift characteristic formula.

$$\Delta t = K/\sqrt{a_1^2 + b_1^2} \qquad (2)$$

Where, "k" is a proportional constant.

When assuming an unforeseen state in view of apparatus management, it is impossible to excessively lengthen the interval "$\Delta t$" in fact. Therefore, the maximum value of the interval is limited.

Figure 3:
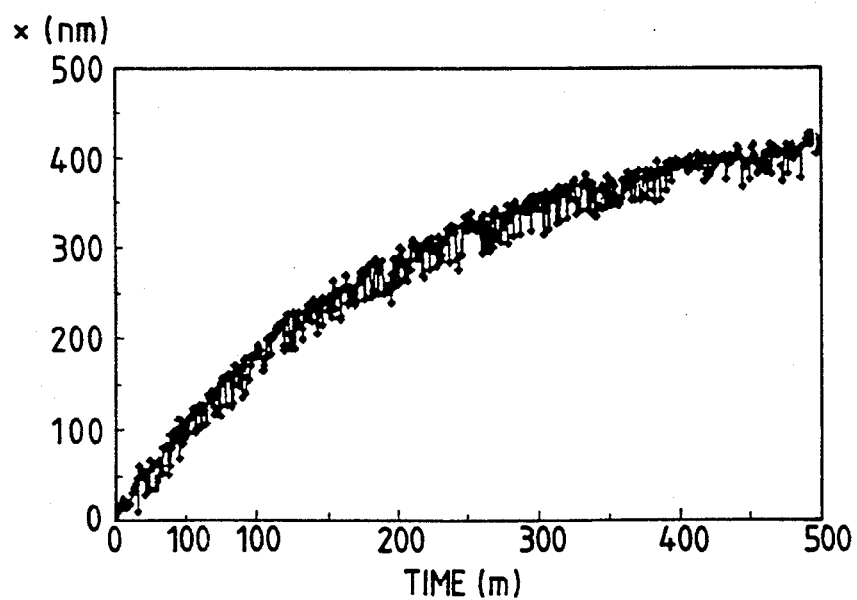
FIG. 3 is measurement data for electron-beam position drift in the present invention.

FIG. 3 shows an example of measured beam position drift X when setting the measuring interval "$\Delta t$" to 1 min. From FIG. 3, it is found that the curve is approximately a quadratic curve. The beam position drift X is almost saturated at the latter half of measured data. Therefore, the correction frequency can greatly be decreased around the latter-half zone. For example, the drift measuring time for one time is assumed as the average of 5 sec. In this case, when the number of times for measurement is decreased by 200, it is possible to decrease the measuring time by 1,000 sec as a whole.

Conventionally, an operator previously sets the drift correction frequency experimentally in accordance with the evaluation results of apparatus environment and past drift correction records. Therefore, the drift correction frequency inevitably tends to be excessive. However, the frequency can be minimized by the method of the present invention. Moreover, because the correction frequency and the number of measuring points can automatically be set, it is possible to greatly improve the throughput of the apparatus.

We claim:

1. An electron beam lithography apparatus for obtaining lithographic patterns on a sample by applying an electron beam thereon, comprising:
    a means for obtaining drift values of an exposure position of the electron beam by detecting reflected electron signals obtained by irradiating the electron beam on a reference mark on a sample stage;
    a memory for storing a plurality of position drift values of the electron beam;
    a means for calculating a drift characteristic formula which expresses the exposure positions of the electron beam by using a plurality of drift values from the memory;
    a deflection correcting circuit for correcting the exposure positions based on the drift characteristic formula in real time at which the electron beam is irradiated; and
    means for controlling the electron beam based on the exposure positions by estimating some of the exposure positions in the real time at which the electron beam is irradiated based on the drift characteristic formula, and by calculating other of the exposure positions based on the drift characteristic formula by detecting the reference mark.

2. An electron beam lithography apparatus according to claim 1, wherein
    said means for calculating a drift characteristic formula calculates the drift characteristic formula approximated to a polygonal line by using the drift values stored in the memory.

3. An electron beam lithography apparatus according to claim 2, wherein
    said means for calculating a drift characteristic formula calculates said drift characteristic expression through the method of least squares.

4. An electron beam lithography apparatus according to claim 2, wherein
    said means for calculating a drift characteristic formula corrects said drift characteristic formula already generated by using drift values detected by said means for obtaining drift values in each lithographic process.

5. An electron beam lithography apparatus according to claim 2, wherein
    said means for obtaining drift values sets time intervals at which the drift values are detected by applying the electron beam to the reference mark on the sample stage in an inversely proportional relationship to a gradient of said drift characteristic formula at a position drift detection time just before the time concerned.

6. An electron beam lithography apparatus according to claim 2, wherein
    the deflection correcting circuit includes means for correcting the exposure positions in a blanking period of the electron beam.

7. An electron beam lithography apparatus according to claim 1, wherein
said means for calculating a drift characteristic formula calculates the drift characteristic formula approximated to a quadratic or higher-order algebraic equation by using the drift values stored in the memory.

8. An electron beam lithography apparatus according to claim 7, wherein
said means for calculating a drift characteristic formula calculated said drift characteristic expression through the method of least squares.

9. An electron beam lithography apparatus according to claim 7, wherein
said means for calculating a drift characteristic formula corrects said drift characteristic formula already generated by using drift values detected by said means for obtaining drift values in each lithographic process.

10. An electron beam lithography apparatus according to claim 7, wherein
said means for obtaining drift values sets time intervals at which the drift values are detected by applying the electron beam to the reference mark on the sample stage in an inversely proportional relationship to a gradient of said drift characteristic formula at a position drift detection time just before the time concerned.

11. An electron beam lithography apparatus according to claim 7, wherein
the deflection correcting circuit includes means for correcting the exposure positions in a blanking period of the electron beam.

12. An electron beam lithography apparatus according to claim 1, wherein
said means for calculating a drift characteristic formula calculates said drift characteristic expression through the method of least squares.

13. An electron beam lithography apparatus according to claim 12, wherein
said means for calculating a drift characteristic formula corrects said drift characteristic formula already generated by using drift values detected by said means for obtaining drift values in each lithographic process.

14. An electron beam lithography apparatus according to claim 12, wherein
said means for obtaining drift values sets time intervals at which the drift values are detected by applying the electron beam to the reference mark on the sample stage in an inversely proportional relationship to a gradient of said drift characteristic formula at a position drift detection time just before the time concerned.

15. An electron beam lithography apparatus according to claim 12, wherein
the deflection correcting circuit includes means for correcting the exposure positions in a blanking period of the electron beam.

16. An electron beam lithography apparatus according to claim 1, wherein
said means for calculating a drift characteristic formula corrects said drift characteristic formula already generated by using drift values detected by said means for obtaining drift values in each lithographic process.

17. An electron beam lithography apparatus according to claim 16, wherein
said means for obtaining drift values sets time intervals at which the drift values are detected by applying the electron beam to the reference mark on the sample stage in an inversely proportional relationship to a gradient of said drift characteristic formula at a position drift detection time just before the time concerned.

18. An electron beam lithography apparatus according to claim 16, wherein
the deflection correcting circuit includes means for correcting the exposure positions in a blanking period of the electron beam.

19. An electron beam lithography apparatus according to claim 1, wherein
said means for obtaining drift values set time intervals at which the drift values are detected by applying the electron beam to the reference mark on the sample stage in an inversely proportional relationship to a gradient of said drift characteristic formula at a position drift detection time just before the time concerned.

20. An electron beam lithography apparatus according to claim 19, wherein
the deflection correcting circuit includes means for correcting the exposure positions in a blanking period of the electron beam.

21. An electron beam lithography apparatus according to claim 1, wherein
the deflection correcting circuit corrects the exposure positions in a blanking period of the electron beam.

* * * * *